(12) United States Patent
Vaesen et al.

(10) Patent No.: US 10,778,190 B2
(45) Date of Patent: Sep. 15, 2020

(54) RF PHASE SHIFTING DEVICE

(71) Applicant: IMEC VZW, Leuven (BE)

(72) Inventors: Kristof Vaesen, Mortsel (BE); Pierre Wambacq, Groot-Bijgaarden (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/981,165

(22) Filed: May 16, 2018

(65) Prior Publication Data

US 2018/0337658 A1 Nov. 22, 2018

(30) Foreign Application Priority Data

May 18, 2017 (EP) .................................... 17171725

(51) Int. Cl.
*H03H 11/16* (2006.01)
*H03H 11/20* (2006.01)
(Continued)

(52) U.S. Cl.
CPC ........... *H03H 11/16* (2013.01); *H03F 1/0216* (2013.01); *H03F 3/19* (2013.01); *H03F 3/211* (2013.01); *H03F 3/45071* (2013.01); *H03F 3/602* (2013.01); *H03F 3/68* (2013.01); *H03H 11/20* (2013.01); *H03F 2200/204* (2013.01); *H03F 2200/336* (2013.01); *H03F 2200/423* (2013.01);
(Continued)

(58) Field of Classification Search
CPC .... H03F 1/56; H03F 1/3282; H03F 2200/192; H03F 2200/198
See application file for complete search history.

(56) References Cited

U.S. PATENT DOCUMENTS 4,511,813 A    4/1985 Pan
6,496,061 B1 *  12/2002 Bloom .................... H03F 3/602
                                                    330/124 R
(Continued)

FOREIGN PATENT DOCUMENTS

EP      3109935 A1    12/2016

OTHER PUBLICATIONS

Meca Electronics, Inc., Hybrid Coupler Basics, 2014, http://www.e-meca.com/rf-microwave-blog/hybrid-coupler-basics, accessed May 22, 2020 (Year: 2014).*

(Continued)

*Primary Examiner* — Thomas J. Hiltunen
(74) *Attorney, Agent, or Firm* — McDonnell Boehnen Hulbert & Berghoff LLP (57) ABSTRACT

A device for phase shifting is disclosed, comprising an input amplifier, a biasing circuit, a first output amplifier and a second output amplifier being variable-gain amplifiers, and a quadrature hybrid coupler. The input amplifier is connected to an input port of the coupler, the first output amplifier is connected to a through port of the coupler, the second output amplifier is connected to a coupled port of the coupler, and the biasing circuit is connected to an isolated port of the coupler. The device also includes, the quadrature hybrid coupler configured to receive, at the input port, an input signal from the input amplifier, output, at the through port, a through signal, receive, at the isolated port, a bias signal from the biasing circuit, and output, at the coupled port, a coupled signal having a phase differing from a phase of the through signal.

20 Claims, 4 Drawing Sheets

(51) Int. Cl.
*H03F 3/60* (2006.01)
*H03F 3/21* (2006.01)
*H03F 1/02* (2006.01)
*H03F 3/19* (2006.01)
*H03F 3/45* (2006.01)
*H03F 3/68* (2006.01)

(52) U.S. Cl.
CPC .. *H03F 2200/451* (2013.01); *H03F 2200/541* (2013.01); *H03F 2200/72* (2013.01); *H03F 2200/75* (2013.01); *H03F 2203/45228* (2013.01)

(56) References Cited

U.S. PATENT DOCUMENTS

| | | | | |
|---|---|---|---|---|
| 6,515,541 | B2* | 2/2003 | Cheng | H03F 3/602 330/124 R |
| 6,743,652 | B2* | 6/2004 | Thomas | H01L 27/1462 257/E27.133 |
| 6,794,953 | B2* | 9/2004 | Brandt | H01P 5/16 330/53 |
| 6,853,176 | B2* | 2/2005 | Lymer | G01R 21/02 324/76.11 |
| 7,215,194 | B2* | 5/2007 | Kucharski | H03F 1/42 330/252 |
| 7,561,854 | B2* | 7/2009 | Manicone | H04B 1/52 455/83 |
| 7,795,966 | B2* | 9/2010 | Wyse | H03F 1/52 330/124 R |
| 8,179,198 | B2* | 5/2012 | Das | H03F 3/45183 330/254 |
| 8,736,336 | B2* | 5/2014 | Kishimoto | H01P 1/18 327/254 |
| 8,817,672 | B2* | 8/2014 | Corman | H01Q 3/26 370/278 |
| 8,890,616 | B2* | 11/2014 | Scott | H03G 3/3042 330/285 |
| 9,634,610 | B2* | 4/2017 | Babaie | H01F 27/2823 |
| 9,818,524 | B2* | 11/2017 | Vaesen | H01F 19/04 |
| 9,948,243 | B2* | 4/2018 | Kobayashi | H03F 1/56 |
| 2004/0095190 | A1* | 5/2004 | Klaren | H03F 3/602 330/124 R |

OTHER PUBLICATIONS

European Search Report, European Patent Application No. 17171725.9, dated Nov. 24, 2017, 10 pages.

Mitilineos, Stelios A. et al., "A New Active RF Phase Shifter Using Variable Gain, Drain Voltage Controlled PHEMTs: A 2.4-GHz ISM Implementation", IEEE Microwave and Wireless Components Letters, vol. 15, No. 7, Jul. 2005, pp. 454-456.

Li, Huiyu et al., "Research on a 0°—360° FET Analog Phase Shifter of X-Band", 2014 IEEE International Conference on Communication Problem-Solving, Dec. 5, 2014, pp. 246-249.

Elkhouly, Mohamed et al., "220-250-GHz Phased-Array Circuits in 0.13-um SiGe BiCMOS Technology", IEEE Transactions on Microwave Theory and Techniques, vol. 61, No. 8, Aug. 2013, pp. 3115-3127.

Shahramian, Shahriar et al., "A 70-100GHz Direct-Conversion Transmitter and Receiver Phased Array Chipset in 0.18um SiGe BiCMOS Technology", 2012 IEEE Radio Frequency Integrated Circuits Symposium, Jun. 17-19, 2012, pp. 123-126.

Medra, Alaa et al., "An 80-GHz Low Noise Amplifier Resilient to the TX-Spillover in Phase-Modulated Continuous-Wave Radars", 2015 IEEE Radio Frequency Integrated Circuits Symposium, May 17-19, 2015, pp. 323-326.

Hettak, K. et al., "A Novel Topology of SiGe Phase Shifters Using Vector Sum Method With Ultra-Low Power Consumption for 5GHz Applications", Proceedings of the 39th European Microwave Conference, Sep. 29-Oct. 1, 2009, pp. 244-247.

Yeh, Yi-Shin et al., "A 28-GHz Phased-Array Receiver Front End With Dual-Vector Distributed Beamforming", IEEE Journal of Solid-State Circuits, vol. 52, No. 5, May 2017, pp. 1230-1244.

* cited by examiner

RF PHASE SHIFTING DEVICE

CROSS-REFERENCE TO RELATED APPLICATIONS

The present application is a non-provisional patent application claiming priority to EP 17171725.9, filed on May 18, 2017, the contents of which are hereby incorporated by reference.

FIELD OF THE DISCLOSURE

The present disclosure generally relates to a phase shifting device comprising an input amplifier, output amplifiers, and a differential quadrature hybrid coupler. More specifically, it relates to a compact device that provides phase shifting through reduced power consumption.

BACKGROUND

Phase shifting devices may be used for providing an output signal having a controllable phase. The phase shifting device may comprise a power splitter for splitting an input signal into two different output ports, and various means for combining the split signal into an output signal having the desired phase.

Phase shifting devices are e.g. utilized in phased array systems, in which an array of antennas creates a beam of radio waves which can be electronically steered to point in different directions without moving the antennas. The steering of the beam may be enabled by the phase shifting devices, which may be arranged at each antenna path for controlling the signal phase of the radio frequency current from the transmitter.

The phased array systems constitute one example of applications wherein the phase shifting devices may be used. In order to improve the overall performance and efficiency of such systems and other applications wherein phase shifting devices may be used, there is a need for phase shifting devices capable of providing smaller phase steps, reduced amplitude variation over the phase steps, and reduced power consumption.

SUMMARY

An objective of the present disclosure is accordingly to provide a phase shifting device which is more compact and allows for reduced power consumption. Additional and alternative objectives may be understood from the following.

The present disclosure describes a phase shifting device, comprising an input amplifier, a biasing circuit, a first output amplifier, a second output amplifier, and a quadrature hybrid coupler. The input amplifier may be connected to an input port of the coupler, the first output amplifier to a through port of the coupler, the second output amplifier to a coupled port of the coupler, and the biasing circuit to an isolated port of the coupler. Furthermore, the hybrid coupler may be configured to receive, at the input port, an input signal from the input amplifier, to output, at the through port, a through signal, to receive, at the isolated port, a bias signal from the biasing circuit, and to output, at the coupled port, a coupled signal having a phase differing from a phase of the through signal. The first output amplifier and the second output amplifier may be variable-gain amplifiers.

Thus, the input amplifier may be used to drive the input port of the coupler and to provide current to the first output amplifier, i.e., the variable-gain amplifier at the through port of the coupler. Since the quadrature hybrid coupler, which e.g. may be of a lumped or distributed configuration, may comprise a terminated fourth terminal, i.e., an isolated port, a biasing circuit may be arranged to bias the isolated port and thereby provide current to the second output amplifier at the coupled port. The biasing circuit may be a duplicated version of the input amplifier, but it does not necessarily act as an amplifier providing an input signal. Instead, the biasing circuit may be arranged to merely provide a biasing current to the second output amplifier, matching the current in the in-phase branch of the coupler.

By using variable-gain amplifiers at the through port and coupled port, a multilevel modulation of the resulting in-phase/coupled signal, output from the coupler, may be achieved.

The phase shifting device may be configured to operate on a differential signal, i.e., a signal formed of a differential signal pair. In such case, the hybrid coupler may be a differential hybrid coupler, connected to differential amplifiers.

According to one embodiment, the input amplifier may be a common source amplifier. A common source amplifier may be understood as a device comprising a transistor in which the signal enters the gate and exits the drain terminal. The input amplifier may hence act as a transconductance amplifier, in which the input voltage may modulate the current flowing through the amplifier and being fed to the input port of the coupler. The common source amplifier may provide more gain as compared to a common gate amplifier, and may be combined with common gate output amplifiers in a cascode configuration. The cascode configuration allows for the amplifiers to share current source and to provide reduced power consumption.

According to an embodiment, the input amplifier may be a differential amplifier that amplifies the difference between two input voltages and outputs a voltage that may be proportional to the difference between the two input voltages. The differential amplifier may comprise a differential pair of common source amplifiers, in which the differential pair of transistors may have a current source connected to their respective sources for setting a biasing current and provide common mode suppression. Alternatively, the input amplifier may be a pseudo-differential amplifier, in which the current source may be removed and the biasing controlled by the gates of the common source transistors. This configuration may leave more headroom for the signal swing, since one fewer transistor is used between the supply and the ground.

According to an embodiment, the structure forming the input amplifier may be the same as the structure forming the biasing circuit. In other words, the input amplifier structure may be duplicated so as to provide a biasing current to match the current in the in-phase branch of the coupler.

According to an embodiment of the present disclosure, the first output amplifier and possibly also the second output amplifier may comprise common gate amplifiers. The common gate amplifier should be understood as a device comprising a transistor in which the source terminal of the transistor serves as the input, the drain is the output and the gate may be connected to a fixed potential serving as a virtual ground for the AC signals. Thus, the signal from the differential through port and/or coupled port of the coupler may enter the source and exit through the drain terminal. The common gate amplifier has relatively low input impedance, which may facilitate matching with the characteristic impedance of the coupler in a relatively compact manner.

The first and second output amplifier may be differential amplifiers similar to what is described with reference to the input amplifier.

The input and/or input amplifiers may e.g. comprise field-effect transistors (FETs).

In one embodiment, the phase shifting device may comprise a common source input amplifier and two common gate output amplifiers, with the differential quadrature hybrid coupler arranged to receive the input signal from the common source input amplifier and to output the through signal and the coupled signal to the first and second common gate output amplifier, respectively. The input amplifier and the output amplifiers may thus form a cascode amplifier, with the coupler arranged between the common source amplifier and the common gate amplifier. In such an arrangement, the common source amplifier may conduct in response to a gate voltage being applied to its gate, whereas the common gate output amplifiers may conduct due to the potential difference now appearing between their gate and source terminals. In an example embodiment, a cascode arrangement with the source voltage of the common gate output amplifier held at a substantially constant voltage during operation may allow for the common gate output amplifier to exhibit a relatively low input resistance to the common source input amplifier. This allows for the input resistance of the input amplifier to be matched with the required impedance of the hybrid coupler. Additionally, cascode configuration allows for the common gate output amplifiers to share the current with the common source input amplifier.

According to an embodiment, the transistor of the common gate output amplifier may have an increased gate length compared to the transistor of the common source input amplifier, so as to increase the output conductance of the output amplifier. By increasing the gate length, the impact of the loading impedance on the source impedance of the output amplifier may be reduced.

According to an embodiment, each of the first and second output amplifiers may comprise a plurality of unit transistors that are interconnected to control the through signal and the coupled signal, respectively. The unit transistors may be individually controlled by bit lines, which, in case of common gate transistors, may act on the gate terminal of the transistor for turning on and off the transistor. This type of controllable transistor structures may also be referred to as variable-gain amplifiers, such as e.g. digital variable-gain amplifiers, which allows for the amplitude of the in-phase signal and the coupled signal to be varied.

According to an embodiment, the first and second output amplifiers may be formed of a set of binary weighted transistors that can be used for combining the in-phase signal and the coupled signal into a desired output signal.

In one example, each of the variable-gain amplifiers comprises four binary weighted transistors that allow for a 4-bit control of the output current.

According to an embodiment, an additional, second set of binary weighted transistors may be added. These transistors may be formed of a similar structure as the above-described first transistor structure, which may be duplicated. This second set of transistors may act as dummy transistors that connect to the VDD and which may be used to keep the total number of switched-on unit transistors of the amplifier constant. Thus, when a unit transistor of a certain size is switched off, a corresponding dummy transistor of the additional set may be switched on to keep the current substantially constant. This allows for a compensation of the impedance variations during the switching of the transistors, resulting in the coupler seeing relatively stable, fixed impedance. The use of such a second set of binary switched transistors hence allows for the input impedance to be maintained at a relatively fixed level for the different switching states, thereby improving the operation of the coupler. The dummy transistors may be controlled by inverted bit lines, such that a dummy transistor of the additional set may be turned on when the corresponding unit transistor is switched off.

However, the first set of binary weighted transistor (and also the set of dummy transistors) only allows a limited range of combinations of the in-phase signal and coupled signal. In case the coupled signal is a quadrature signal, having a phase shift of 90°, combinations may be provided only in the first quadrant of the full 360° phase range. Therefore, a third set of transistors may be provided, which may be a duplicated version of the first transistor structure, and which may be connected to the opposite signal of the differential signal pair. By swapping the positive and negative signals of the differential signal pair, a 180° phase shift may be achieved which allows for the full 360° phase range to be reached. In this way, an additional control bit may be provided, which allows of the resulting combined output signal to be formed also of a negative in-phase and/or coupled signal.

When combined with the 4-bit control provided by the binary weighted four transistor structure described above, the third set of transistors allows for a 5-bit control of the output current.

According to an embodiment, the phase shifting device may comprise a combining means connected to the first and second output amplifier. The combining means may be configured to combine the through signal (i.e., the in-phase signal) and the coupled signal into a combined output signal. The combining means may e.g. comprise a transformer, an inductor or a transmission line.

According to an embodiment, the differential quadrature hybrid coupler may be a quadrature coupler comprising four coils arranged in a first layer and a second layer. The first layer and the second layer may be separated from each other by an intermediate dielectric layer. The first coil may be arranged such that at least one turn extends in the first layer and another turn extends in the second layer. Similarly, the second coil may be arranged such that at least one turn extends in the first layer and another turn extends in the second layer. The at least one turn of the second coil arranged in the first layer is further arranged along at least a portion of the first coil arranged in the first layer, wherein the another turn of the second coil arranged in the second layer may be arranged along at least a portion of the first coil arranged in the second layer. The third coil may be arranged such that at least one turn of the third coil extends in the first layer and superposes at least a portion of the first coil arranged in the second layer, and such that another turn of the third coil extends in the second layer and is superposed by at least a portion of the first coil arranged in the first layer. The fourth coil may extend in the first layer and superposes at least a portion of the second coil arranged in the second layer, and such that another turn of the fourth coil extends in the second layer and is superposed by at least a portion of the second coil arranged in the first layer.

The differential input port may be formed by a first terminal of the first coil and a first terminal of the second coil, the differential through port by a second terminal of the first coil and a second terminal of the second coil, the differential coupled port by a second terminal of the third coil and a second terminal of the fourth coil, and the differential isolated port by a first terminal of the third coil and a first terminal of the fourth coil.

It is to be understood that the terminology used herein is for purpose of describing particular embodiments only, and is not intended to be limiting. It must be noted that, as used in the specification and the appended claim, the articles "a," "an," "the," and "said" are intended to mean that there are one or more of the elements unless the context clearly dictates otherwise. Thus, for example, reference to "a unit" or "the unit" may include several devices, and the like. Furthermore, the words "comprising," "including", "containing" and similar wordings does not exclude other elements or steps.

BRIEF DESCRIPTION OF THE FIGURES

The above, as well as additional objects, features and advantages of the present disclosure will be better understood through the following illustrative and non-limiting detailed description, with reference to the appended drawings. In the drawings like reference numerals will be used for like elements unless stated otherwise.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1A:
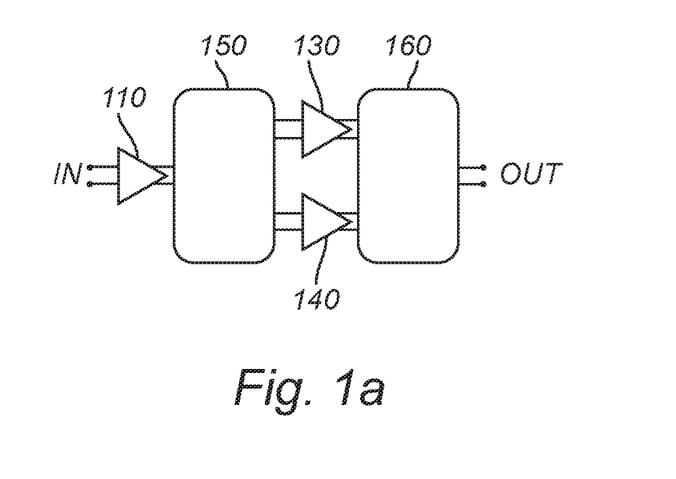
FIG. 1a illustrates a general schematic of a phase shifting device, according to an example embodiment.

FIG. 1a illustrates a phase shifting device 100 according to an embodiment of the present disclosure. The phase shifting device 100 may comprise an input amplifier 110, a differential quadrature hybrid coupler 150, two output amplifiers 130, 140 and a combining means 160. The phase shifting device 100 may be configured to receive, at the input amplifier 110, an input signal IN, which e.g. may comprise a differential pair of signals P, N. The input signal IN may be amplified by the input amplifier 110 to a level necessary for driving the input of the coupler 150. In the coupler 150, the signal may be divided into two signals, a first one I which may be in phase with the input signal IN and a second, coupled signal Q which may have different phase φ relative the in-phase signal I. In case the coupler is a quadrature hybrid coupler, the coupled signal (or quadrature signal) Q may differ 90° from the in-phase signal I.

Subsequently, the in-phase signal I and the coupled signal Q may be transmitted to the first output amplifier 130 and the second output amplifier 140, respectively, in which the different phases I, Q are weighted and transmitted to a combining means 160 to generate the desired output signal OUT. The output amplifiers 130, 140 may e.g. be digitally controlled variable amplifiers allowing a discrete number of combinations of the amplitude of the I and Q signals.

Figure 1B:
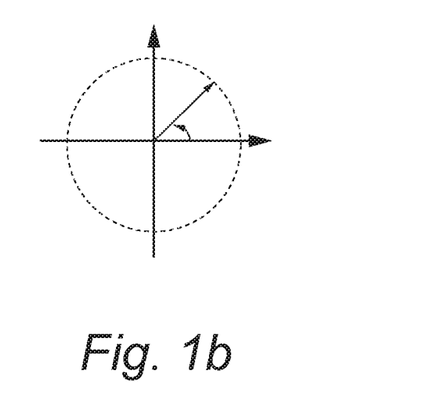
FIG. 1b is a diagram showing different amplitude combinations of the through signal and the coupled signal, according to an example embodiment.

FIG. 1b is a schematic illustration of the phase components of the combined output signal OUT. The resulting output signal OUT is indicated by the arrow, and the phase difference by φ. The amplitude of the in-phase signal I and the coupled signal Q may be scaled with the aim to keep the amplitude of the resulting output signal OUT approximately constant. Using e.g. four-bit output amplifiers may result in 256 different combinations in the first quadrant of the I/Q diagram. About 30 of the combinations, which are closest to the unity circle, may be included. Other quadrants may be used by swapping the polarity of the in-phase signal I and the coupled signal Q, resulting in a fifth control bit.

Figure 2:
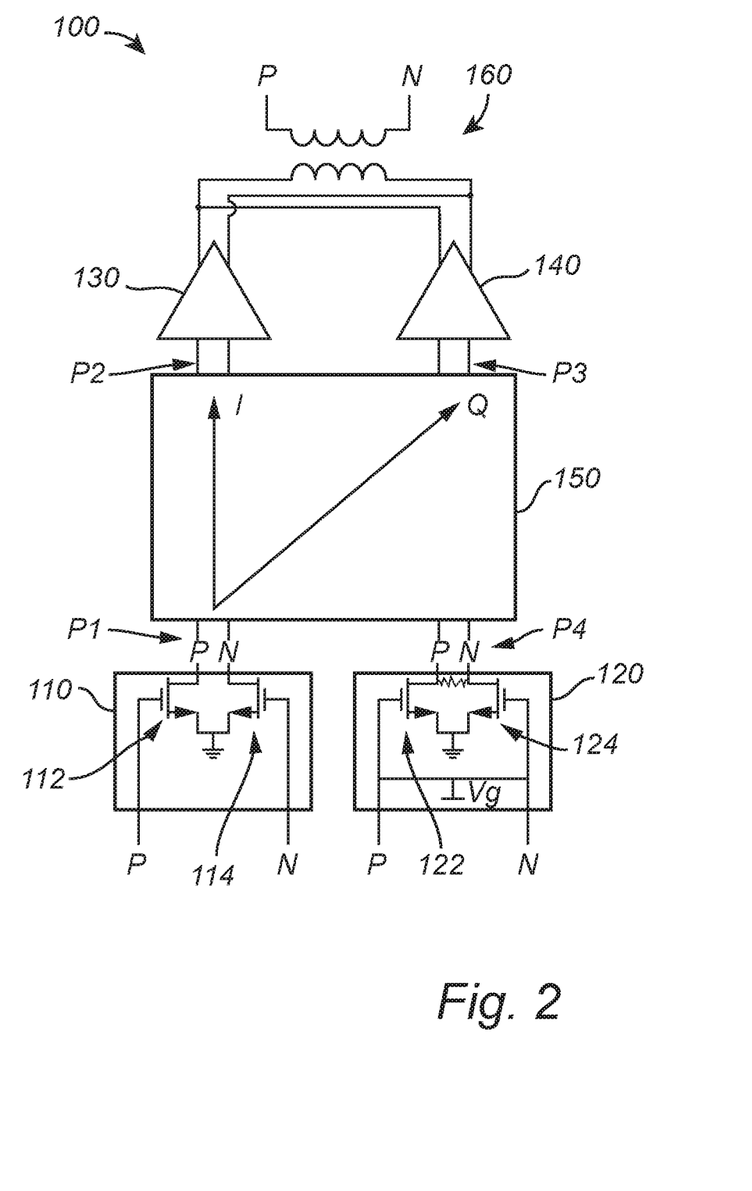
FIG. 2 shows a schematic of a phase shifting device, according to an example embodiment.

FIG. 2 illustrates a phase shifting device 100 according to an embodiment, which may be similarly configured as the one described with reference to FIG. 1a above. The phase shifting device 100 may comprise a coupling element, such as e.g. a quadrature hybrid coupler 150, for splitting an input signal IN into an in-phase signal I and a coupled signal Q. The coupler 150 may comprise an input port P1 and a through port P2, between which the input signal IN may be transmitted without having its phase shifted. Furthermore, the coupler 150 may comprise a coupled port P3, at which the coupled (quadrature) signal Q may be provided. In some embodiments, the coupler 150 may comprise a fourth terminal, which may be an isolated or terminated port P4. In example embodiments, the hybrid coupler 150 may be a differential coupler for handling a differential signal P, N of the input signal IN.

The input port P1 may be connected to an input amplifier 110, which e.g. may be a differential common source input amplifier 110 providing gain for driving the coupler 150. The input amplifier 110 may e.g. comprise a first common source amplifier 112, configured to receive the N signal of the differential pair of forming the input signal IN, and a second common source amplifier 114 that is configured to receive the P signal of the differential pair. As indicated in the present figure, the common source amplifiers 112, 114 may be formed of a respective field-effect transistor (FET) to which the input signal may be applied to the gate terminal and whose source terminal may be connected to ground. Thus, the input signals P, N may be applied to the gate terminal to allow the output current to flow between the drain terminal and the source terminal of the transistors 112, 114.

A similar structure may be connected to the isolated port P4 of the coupler 150, thus forming a biasing circuit 120 comprising a first common source amplifier 122 and a second common source amplifier 124. As no input signal is provided on this port, the gate terminals of the respective transistors 122, 124 of the biasing circuit 120 may be connected to a common, biasing source Vg for supplying a matching current to the coupler 150.

The through port P2 may be connected to a first output amplifier 130, which e.g. may be a differential variable-gain amplifier 130 configured to vary the amplitude of the in-phase signal I. A similar structure 140 may be arranged at the coupled port P3 for allowing the amplitude of the coupled signal Q to be varied. These output amplifiers 130, 140 will be described in more detail in connection with FIG. 3.

The performance of the coupler 150 may depend on parameters such as e.g. bandwidth, phase balance and amplitude balance of the coupler 150. These parameters may also be influenced by the loading of the outputs P2, P3 of the coupler 150. For proper operation of the coupler 150, the outputs P2, P3 of the coupler 150 may be terminated by an impedance corresponding to the characteristic impedance of the coupler 150. This impedance may e.g. be in the range of 30 to 100 Ohm.

The phase shifting device 100 may further comprise a combining means, comprising e.g. a transformer 160, for combining the in-phase component I and the coupled component Q of the signal into a common output signal OUT, as described in connection with FIG. 1b.

Figure 3:
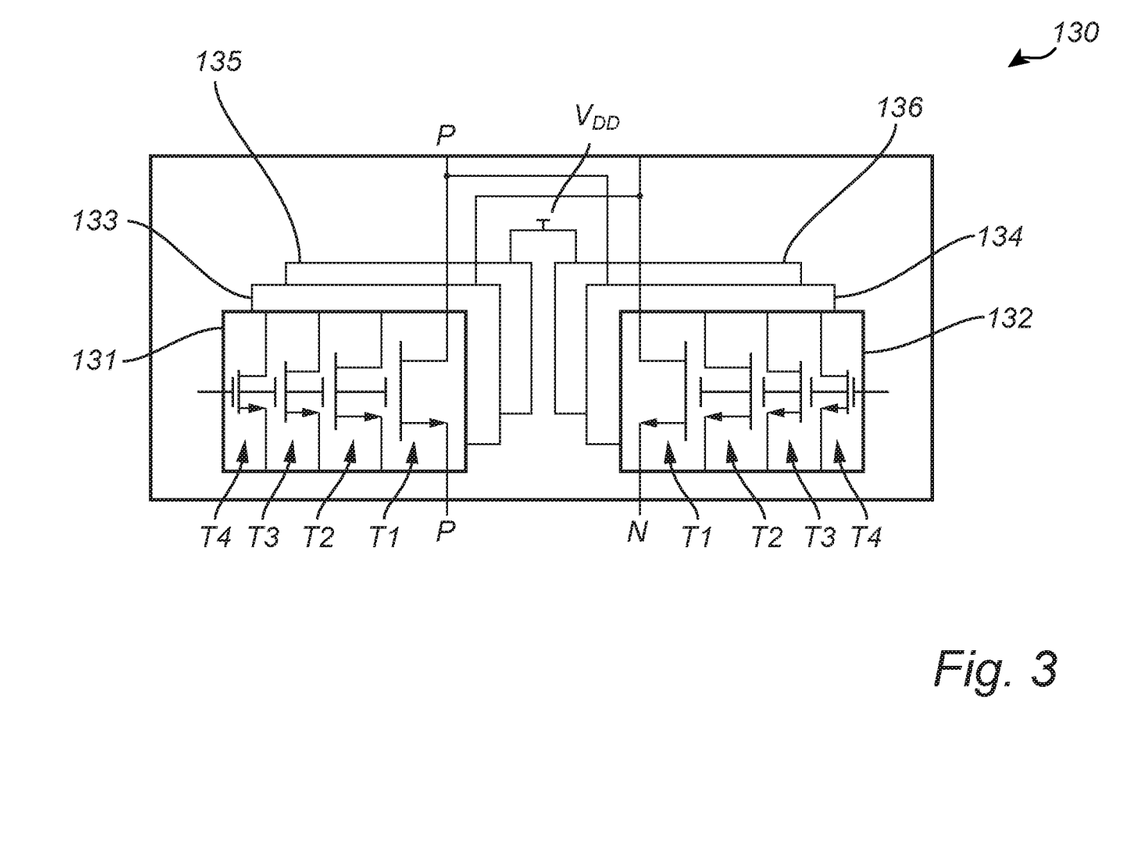
FIG. 3 shows a schematic of a variable-gain amplifier, according to an example embodiment.

FIG. 3 shows a schematic layout of a first output amplifier 130, which may be similarly configured as the amplifiers discussed in connection with FIGS. 1a and 2. Even though only the first output amplifier 130 will be described in detail in the following, it is appreciated that the same description, features and advantages may apply to the second output amplifier 140 as well.

The output amplifier 130 may in some examples be a digitally controlled variable-gain amplifier (VGA), and may together with the second output amplifier 140 be configured to weigh the I/Q signals, generated by the coupler 150, separately and to generate the corresponding phase at the combined output signal OUT.

The VGA 130 may comprise a plurality of unit transistors T1, T2, T3, and T4, whose operation may be individually controlled by dedicated bit lines (not shown). In one example, the unit transistors T1-T4 may be common gate transistors interconnected in a weighted amplifier structure, forming a first set of transistors 131, 132. Such transistors T1-T4 may provide an input impedance that is inversely proportional to their transconductance, thereby making relatively low impedances possible without any additional matching.

In the present example illustrated in FIG. 3, the VGAs 130, 140 may comprise four binary weighted transistors T1-T4, arranged in a first amplifier structure 131 allowing a 4-bit control of the output current. In some embodiments, the binary switched VGAs 130, 140 keep their input impedance relatively fixed for every switching state. However, changing the output current also changes the current at the source and thus the impedance seen at the source of the amplifier structure 131.

Hence, an additional, second set 135, 136 of binary weighted transistors may be placed in parallel with the first amplifier structure 131. The second set 135, 136 of transistors may thus act as dummy transistors that connect to the VDD and are used to keep the total number of switched-on unit transistors constant. Thus, when a unit transistor T1-T4 of a certain size is switched off in the first set 131, 132, a corresponding dummy transistor of the second set 135, 136 may be switched on to keep the current in the output amplifier 130 substantially constant. This allows for a compensation of the impedance variations during the switching of the VGAs 130, 140, resulting in the coupler 150 seeing a relatively stable, fixed impedance and thus in an improved operation of the coupler 150. The dummy transistors may be controlled by inverted bit lines, thereby allowing a dummy transistor of the second set 135, 136 to be turned on when the corresponding unit transistor T1-T4 is switched off.

To reach the full 360° spectrum of combinations of the in-phase signal I and the coupled signal Q, a third set of transistors 133 may be provided. The third set 133 may form a similar structure as the first amplifier structure 131, i.e., comprising a set of binary weighted unit transistors T1-T4, in which the positive signal N and the negative signal P of the differential signal pair of the in-phase signal I and the coupled signal Q are switched. In other words, the output of the first set 131, 132 and the third set 133, 134 may result in opposite polarities, which allows for the combined output signal OUT to be formed of both positive and negative I/Q combinations, i.e., combinations positioned also in the second, third and fourth quadrant of the I/Q diagram discussed in connection with FIG. 1b.

Figure 4:
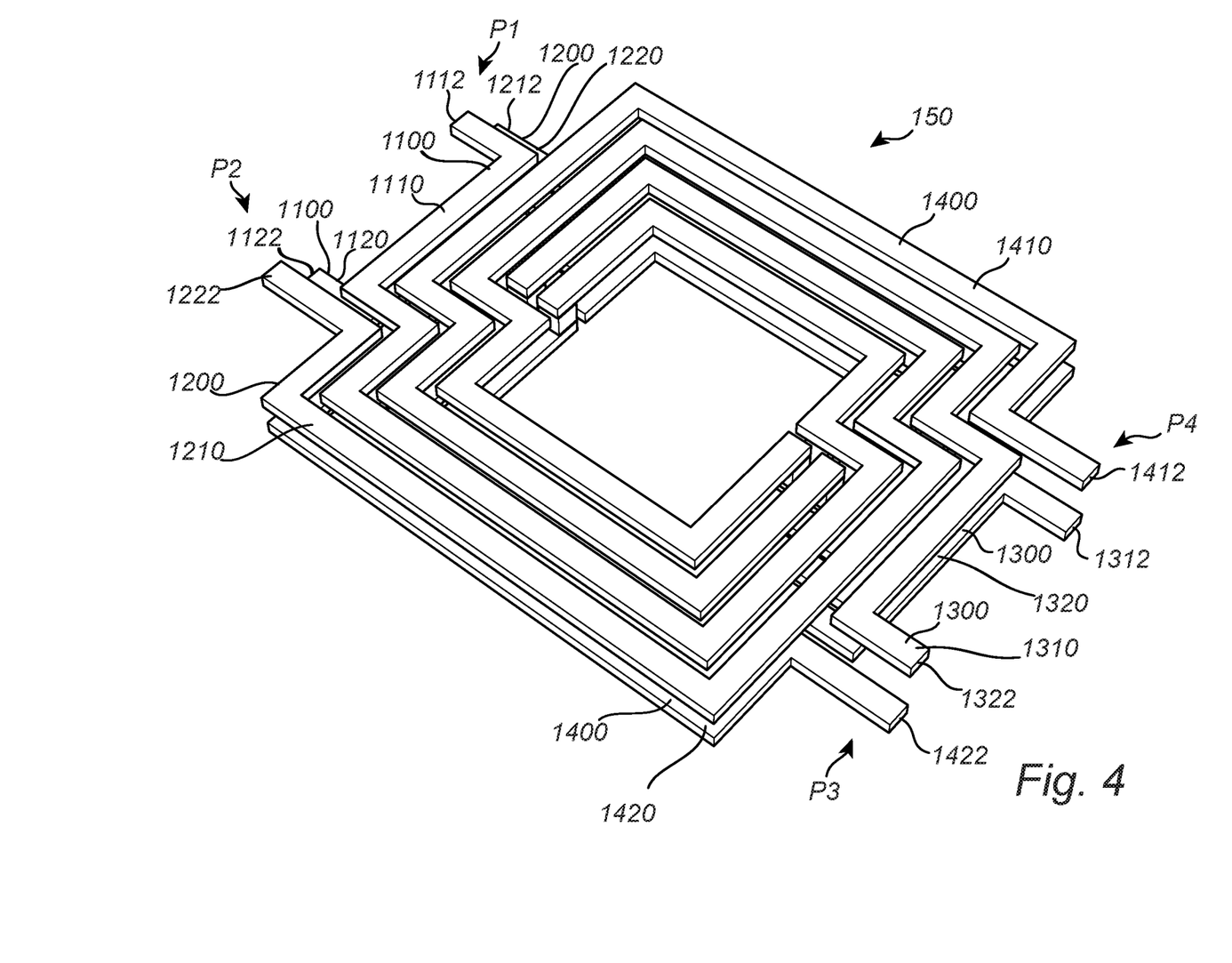
FIG. 4 illustrates a perspective view of a coupler, according to an example embodiment.

FIG. 4 shows a perspective view of a quadrature hybrid coupler 150 according to an embodiment, which may be similarly configured as the couplers 150 discussed in connection with the previous figures. The coupler 150 may comprise four coils 1100, 1200, 1300, 1400, each of which having at least four turns extending in a first layer and a second layer, respectively. As indicated in the present figure, the first coil 1100 may comprise a first terminal 1112 and a second terminal 1122 and may be arranged such that at least one turn 1110, forming a part of the coil 1100, extends in the first layer and at least another turn 1120 extends in the underlying, second layer. The first and second layers, and hence the respective turns 1110, 1120 of the first coil 1100, may be separated from each other by an intermediate dielectric layer (not shown).

According to the present disclosure, the first terminal 1112 and the second terminal 1122 of the first coil 1100 may be arranged on a same side of the coupler 150 such that, during operation, power that is input at e.g. the first terminal 1112 may be output at the same side of the coupler 150.

The second coil 1200 may be similarly arranged as the first coil 1100, extending in the first layer and the second layer and having a first terminal 1212 and a second terminal 1222. Furthermore, the second coil 1200 may be arranged such that at least one turn 1210 of the second coil 1200 extends in the first layer and along at least a portion of the first coil 1100, i.e., along, or side by side with, at least a portion of the at least one turn 1110 arranged in the first layer. Additionally, another turn 1220 of the second coil may be arranged to extend in the second layer and along at least a portion of the first coil 1100, i.e., along at least a portion of the turn 1120 of the first coil 1100 arranged in the second layer.

By arranging the first coil 1100 and the second coil 1200 such that the first terminal 1112 of the first coil 1100 is connected to the turn 1110 of the first coil 1100 that extends in the first layer, and such that the first terminal 1212 of the second coil 1200 is connected to the turn 1220 of the second coil 1200 that extends in the second layer, the first coil 1100 and the second coil 1200 can be described as two oppositely routed coils. Accordingly, the second terminal 1122 of the first coil 1100 is connected to the turn 1120 of the first coil 1100 that extends in the second layer, whereas the second terminal 1222 of the second coil 1200 is connected to the turn 1220 of the second coil 1200 that extends in the first layer. By arranging the second coil 1200 such that is at least partly extends along the first coil 1100 in a same plane, between the first coil 1100 and the second coil 1200, may be used to provide or modify the characteristic impedance of the coupler 150. Furthermore, as a signal is provided at the first terminal 1112 and the second terminal 1212, the opposite routing of the first coil 1100 and the second coil 1200 allows for a differential signaling wherein the electromagnetic fields that are generated by the complementary signals P, N are directed in the same directions, thereby avoiding or at least reducing the risk of the magnetic fields canceling or counteracting each other.

The third coil 1300 and the fourth coil 1400 maybe similarly arranged as the first coil 1100 and the second coil 1200. As indicated in the present figure, at least one turn 1310 of the third coil 1300 may be arranged to extend in the first layer and such that it superposes at least a portion 1120 of the first coil arranged in the second layer. Moreover, another turn 1320 of the third coil may be arranged to extend in the second layer and to superpose at least a portion 1110 of the first coil 1100 arranged in the first layer. By arranging the third coil 1300 such that it at least partly superposes the first coil 1100, i.e., such that the first coil 1100 and the third coil 1300 are arranged in a stacked arrangement in relation to each other, an electromagnetic interaction may be provided. The electromagnetic interaction may allow for a transformer action between the first coil 1100 and the third coil 1300. The third coil 1300 may have a first terminal 1312 connected to the turn 1320 of the third coil 1300 that may be arranged in the second layer, and a second terminal 1322 connected to the turn 1310 of the third coil 1300 that may be arranged in the first layer.

The fourth coil 1400 may comprise at least one turn 1410 that may be arranged to extend in the first layer and such that it superposes at least a portion 1220 of the second coil 1200 arranged in the second layer, and at least one turn 1420 that is arranged to extend in the second layer and such that it is superposed by at least a portion 1210 of the second coil 1200 arranged in the first layer. In addition, the fourth coil 1400 may comprise a first terminal 1412 that may be connected to the turn 1410 arranged in the first layer, and a second terminal 1422 that is connected to the turn 1420 arranged in the second layer. Similarly to what is described above in connection to the third coil 1300, a transformer coupling may be provided between the fourth coil 1400 and the second coil 1200.

As the third coil 1300 and the fourth coil 1400 may be routed or operated in opposite directions, they may be used for differential signaling in a similar way as described with reference to the first coil 1100 and the second coil 1200.

The coupler 150 may furthermore comprise a differential input port P1 formed by the first terminal 1112 of the first coil 1100 and the first terminal 1212 of the second coil 1200. The second terminal 1122 of the first coil 1100 and the second terminal 1222 of the second coil 1200 may form a differential through port P2, wherein the differential input port P1 and the differential through port P2 may be arranged on the same side or opposite sides of the coupler 150. Similarly, the first terminal 1312 of the third coil 1300 and the first terminal 1412 of the fourth coil 1400 may form a differential isolated port P4, whereas the second terminal 1322 of the third coil 1300 and a second terminal 1422 of the fourth coil 1400 may form a differential coupled port P3.

In the above example embodiments the disclosure has mainly been described with reference to a limited number of examples. However, other examples than the ones disclosed above are equally possible within the scope of the present disclosure, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A device for phase shifting, comprising:
a quadrature hybrid coupler;
an input amplifier directly coupled to an input port of the quadrature hybrid coupler;
a biasing circuit directly coupled to an isolated port of the quadrature hybrid coupler;
a first output amplifier directly coupled to a through port of the quadrature hybrid coupler; and
a second output amplifier directly coupled to a coupled port of the quadrature hybrid coupler,
wherein the quadrature hybrid coupler is configured to:
receive, at the input port, an input signal from the input amplifier;
output, at the through port, a through signal;
receive, at the isolated port, a bias signal from the biasing circuit; and
output, at the coupled port, a coupled signal having a phase differing from a phase of the through signal,
wherein the first output amplifier and the second output amplifier are variable-gain amplifiers, and
wherein the first output amplifier, the second output amplifier, and the input amplifier are configured as a cascode circuit, wherein the first output amplifier and the second output amplifier share current with the input amplifier.

2. The device of claim 1, configured to operate on a differential input signal.

3. The device of claim 2, wherein the input amplifier is a differential amplifier.

4. The device of claim 1, wherein the input amplifier is a common source amplifier.

5. The device of claim 4, wherein the input amplifier is a pseudo-differential amplifier.

6. The device of claim 1, wherein the first and second output amplifiers are common gate amplifiers.

7. The device of claim 6, wherein the first and second output amplifiers are differential amplifiers.

8. The device of claim 6 wherein each of the first and second output amplifiers comprises a first set of a plurality of unit transistors that are interconnected to control the through signal and the coupled signal, respectively.

9. The device of claim 8, wherein the plurality of unit transistors form a binary weighted amplifier structure.

10. The device of claim 8, wherein each of the first and second output amplifiers further comprises a second set of dummy transistors for compensating current variations in the first and second output amplifiers.

11. The device of claim 10, wherein the first set of the plurality of unit transistors are individually operated by bit lines and wherein the second set of dummy transistors are operated by inverted bit lines.

12. The device of claim 8, wherein each of the first and second output amplifiers further comprises a third set of a plurality of unit transistors, wherein the first set of the plurality of unit transistors and the third set of the plurality of unit transistors are connected to opposite signals of a differential signal pair of the through signal and the coupled signal, respectively.

13. The device of claim 1, further comprising a combining means connected to the first and second output amplifiers and configured to combine the through signal and the coupled signal into a combined output signal.

14. The device of claim 13, wherein the combining means comprises a transformer, an inductor or a transmission line.

15. The device of claim 1, wherein the quadrature hybrid coupler further comprises at least four coils, wherein each coil has at least four turns extending in a first layer and a second layer, respectively.

16. The device of claim 15, wherein the quadrature hybrid coupler further comprises a first terminal and a second terminal and is arranged such that at least one turn, forming a part of a coil, extends in the first layer and at least another turn extends in the second layer, wherein the second layer is arranged under the first layer.

17. The device of claim 16, wherein the quadrature hybrid coupler further comprises the first and second terminal of the coil arranged on a same side of the quadrature hybrid coupler.

18. A method comprising:
receiving, at an input port of a quadrature hybrid coupler, an input signal from an input amplifier;
receiving, at an isolated port of the quadrature hybrid coupler, a bias signal from a biasing circuit;
outputting, from a through port of the quadrature hybrid coupler to a first output amplifier, a through signal; and
outputting, from a coupled port of the quadrature hybrid coupler to a second output amplifier, a coupled signal,
wherein the coupled signal has a phase differing from the phase of the through signal,
wherein the first output amplifier and the second output amplifier are variable-gain amplifiers, and
wherein the first output amplifier, the second output amplifier, and the input amplifier are configured as a cascode circuit, wherein the first output amplifier and the second output amplifier share current with the input amplifier.

19. The method of claim 18, wherein the input signal is a differential input signal.

20. The method of claim 18, further comprising:
combining the through signal and the coupled signal into a combined output signal.

* * * * *